United States Patent [19]
Oketani et al.

[11] Patent Number: 5,893,687
[45] Date of Patent: Apr. 13, 1999

[54] PLATE SUPPRESSING DEVICE FOR DRILLING APPARATUS

[75] Inventors: Tetsuya Oketani, Gifu; Tadashi Uemura, Anjo, both of Japan

[73] Assignee: Howa Machinery, Ltd., Aichi-ken, Japan

[21] Appl. No.: 09/111,147

[22] Filed: Jul. 6, 1998

[30] Foreign Application Priority Data

Jul. 10, 1997 [JP] Japan .................................. 9-202275

[51] Int. Cl.$^6$ .................................................. B23B 39/00
[52] U.S. Cl. .......................... 408/97; 408/67; 408/97; 483/55
[58] Field of Search ........................... 408/67, 72 B, 408/95, 97, 112, 241 B; 483/55

[56] References Cited

U.S. PATENT DOCUMENTS

| 4,515,505 | 5/1985 | Frisbie et al. ....................... 408/97 |
| 4,813,825 | 3/1989 | Kosmowski .......................... 408/95 |
| 5,332,341 | 7/1994 | Arai et al. .......................... 408/95 |

FOREIGN PATENT DOCUMENTS

| 4-2437 | 1/1992 | Japan . |
| 4-122537 | 4/1992 | Japan . |
| 4-176535 | 6/1992 | Japan . |
| 4-354609 | 12/1992 | Japan . |

*Primary Examiner*—Daniel W. Howell
*Assistant Examiner*—Monica Smith
*Attorney, Agent, or Firm*—Ladas & Parry

[57] ABSTRACT

When a spindle unit 1 rises to a tool change position P1 of a printed-circuit board drilling apparatus, a pair of cam followers 27, which have been spaced downward from a pair of operating pins 38, are brought into engagement with conical portions 39 of the operating pins 38 and caused to move toward each other. As a result, a pair of opening/closing arms 24 that are provided under a pressure foot 20 and that serve as suppressing members for preventing floating of the printed-circuit board are moved away from their suppressing positions A in which the opening/closing arms 24 are kept closed by the force of a spring 28, to their retracted positions B. Consequently, forward end portions of the opening/closing arms 24 are positioned outside a tool passage zone S through which a tool post passes when a tool is changed. As a result, the suppressing members 24 used to prevent floating of the printed-circuit board are retracted without using a drive source, when tool change is made, so that the suppressing members do not become an obstacle to performing the tool change operation.

13 Claims, 7 Drawing Sheets

PLATE SUPPRESSING DEVICE FOR DRILLING APPARATUS

FIELD OF THE INVENTION

The present invention relates to a plate retaining or suppressing device in a drilling apparatus such as a printed-circuit board drilling apparatus.

DESCRIPTION OF THE RELATED ART

Japanese Patent Application Laid-Open Publication No. Hei 4-354609 discloses an arrangement wherein on a forward side of a pressure foot provided with a through-hole permitting the insertion of a maximum-diameter tool therethrough, there is provided a slide member having a plurality of through-holes corresponding to different tool diameters. This slide member is moved by a cylinder provided on the pressure foot to thereby locate a through-hole corresponding to a selected tool at the forward side of the pressure foot. Thus a printed-circuit board is reliably suppressed and held by an edge portion of this through-hole. By this suppressing operation, the printed-circuit board being drilled is prevented from rising or floating, whereby the production of warp and ingress of chips between the wired portions of the printed-circuit board is prevented.

In this type of printed-circuit board drilling apparatus, the tool is replaced or changed by being pushed from below toward a spindle (see Japanese Patent Application Laid-Open Publications Nos. Hei 4-2437, 4-176535 or 4-122537). However, in the first mentioned prior art publication, no description is made of how the slide member is handled when the tool is changed. According to this publication, the movement of the slide member is performed using a cylinder provided solely for that purpose. In this case, even if the slide member is completely retracted from the forward zone of the pressure foot during the tool change, control of this cylinder is needed, which is disadvantageous.

SUMMARY OF THE INVENTION

The present invention has been made in view of the above-described conventional technique and an object of the present invention is to provide a printed-circuit board suppressing device in which a suppressing member is retracted without use of a drive source when the tool is changed and in which when drilling is performed, the vicinity of the edge of a hole being formed is retained or suppressed to thereby prevent floating of the printed-circuit board and to thereby prevent defective drilling operation.

According to the present invention, there is provided plate suppressing device for drilling apparatus, which comprises a pressure foot mounted on a forward end of an axially movably provided spindle unit and having a tool passage hole; and a suppressing member provided at a forward side of the pressure foot and forming a tool insertion hole which permits passage therethrough of a tool mounted on the forward end of the spindle unit with when drilling is performed, the pressure foot suppressing and holding plates through the suppressing member while a hole is being drilled in the plates by the tool; wherein the suppressing member is movable between a retracted position which is retracted from a tool passage zone in which tool change is performed through the tool passage hole of the pressure foot and a suppressing position in which the tool insertion hole of the suppressing member is coaxial with the tool passage hole of the pressure foot; and wherein there is further provided means for moving the suppressing member from

2 the suppressing position to the retracted position in response to movement of the spindle unit to a tool change position where a tool mounted on the forward end of the spindle unit is changed.

DETAILED DESCRIPTION OF THE PREFERRED EMBODIMENTS

Figure 1:
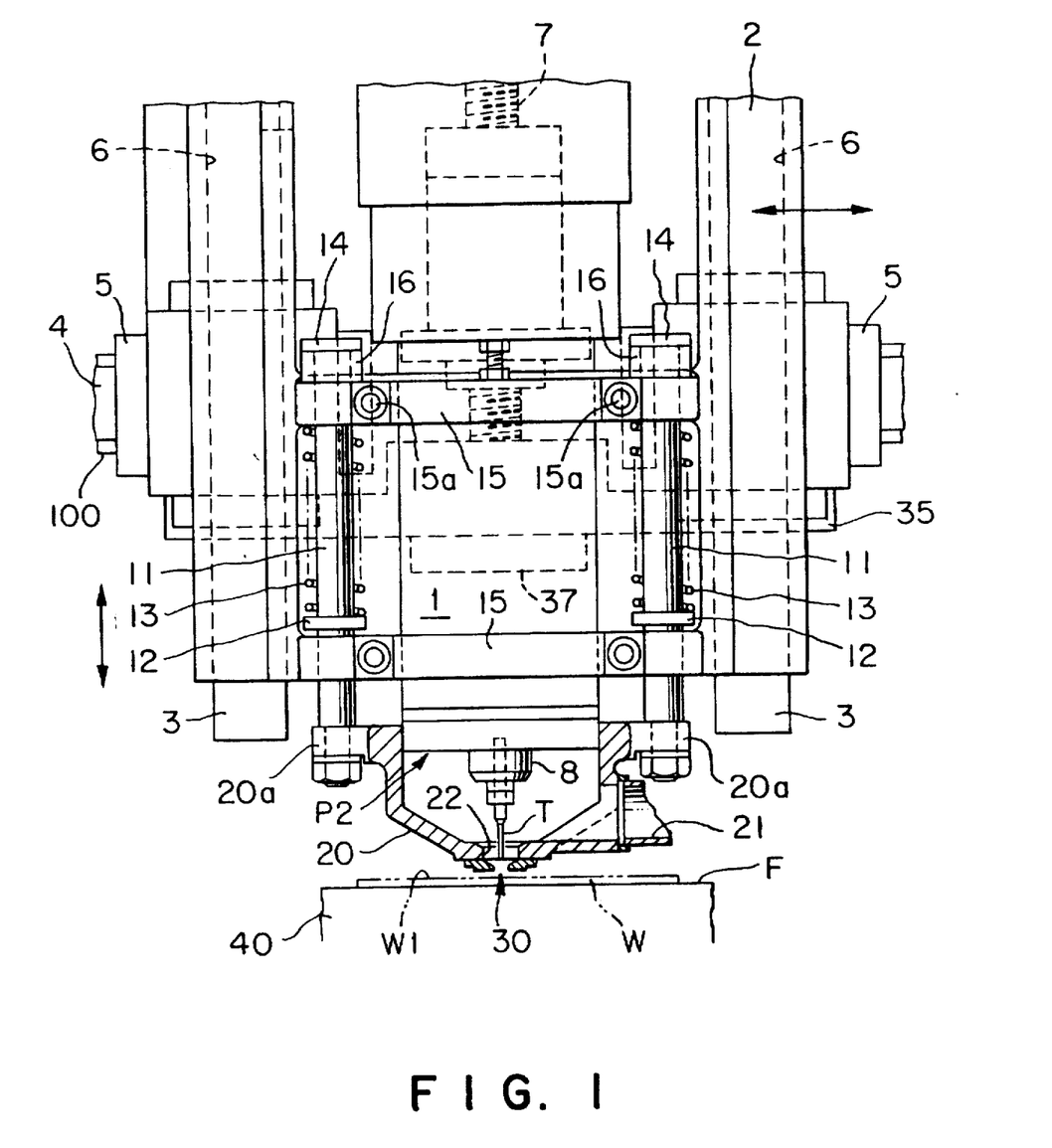
FIG. 1 is a front view illustrating a spindle part of a printed-circuit board holding apparatus having equipped thereto a pressing device according to the present invention.
Figure 2:
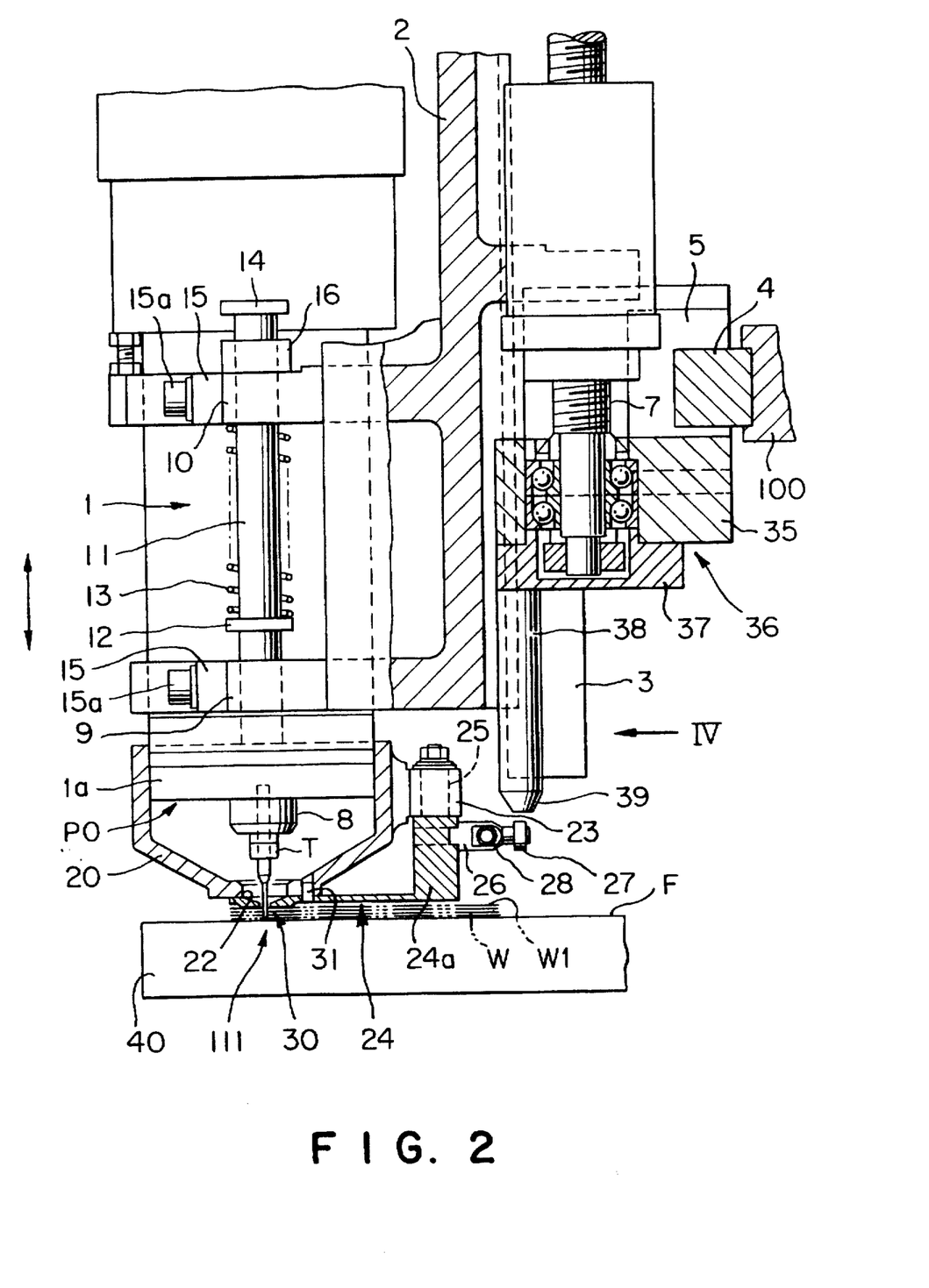
FIG. 2 is a side view of FIG. 1 in which a part of the apparatus is illustrated in section and which illustrates a state where drilling is being performed.

As illustrated in FIGS. 1 and 2, a spindle unit 1 is fixedly held on upper and lower walls 9 and 10 that protrude forwards horizontally from a vertically movable base 2 by means of fastening members 15. Each fastening member 15 has a fastening screw 15a. On both sides of a rear surface of the vertically movable base 2 there are provided a pair of stationary guide rails 3 extending vertically. On a stationary bed 100 there are supported a pair of horizontal guide rails 4 (only a lower side one is illustrated. On an upper side there is another one). The guide rails 3 are guided by vertical guide grooves 6 formed in front surfaces of a pair of right and left guide members 5 which are guided horizontally by the guide rails 4. The guide rails 3 are vertically moved by a feed screw shaft 7. The spindle unit 1 rotatably supports a spindle 8 in a manner that the spindle 8 can be vertically moved.

Between the upper and the lower walls 10 and 9 there are provided on both sides of the spindle unit 1 a pair of guide rods 11 which are slidable vertically. The upper end of each guide rod 11 protrudes upwardly beyond a guide bush 16 fixed to the upper wall 10. A hook portion 14 is provided on the protruding part of the guide rod 11. The lower end of the guide rod 11 protrudes downwardly from the lower wall 9, and mounting portions 20a provided on the right and left sides of a pressure foot 20 are connected to the lower ends of the guide rods 11. At an intermediate portion of each guide rod 11 there is integrally provided a flange-like retainer portion 12. A compression spring 13 is interposed between the retainer portion 12 and the upper wall 10. By the force of the spring 13, the hook portion 14 is urged downward so as to be abutted on the upper surface of the guide bush 16, whereby downward movement of the guide rod 11 relative to the base 2 is limited.

Figure 5:
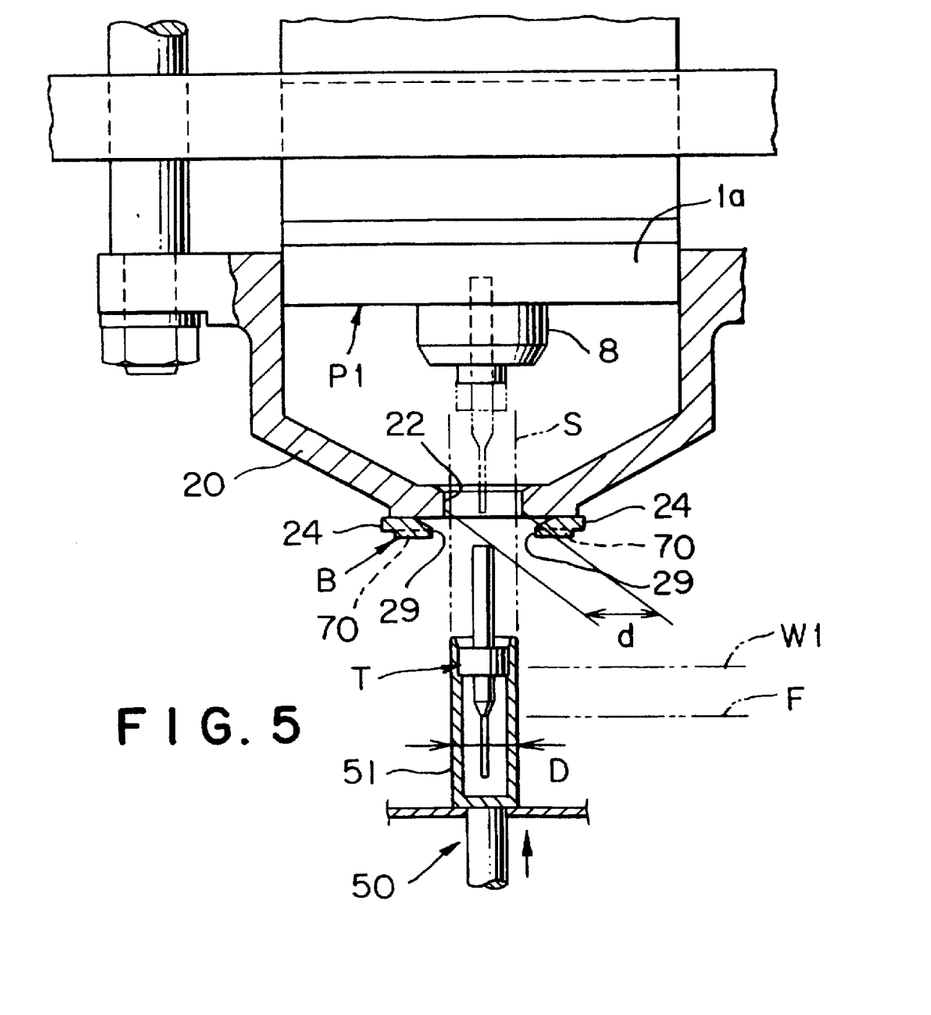
FIG. 5 is a view illustrating a state of changing a tool.

The pressure foot 20 is fitted on a lower end portion 1a of the spindle unit 1 so that the pressure foot 20 may be movable in the axial (vertical) direction. The pressure foot 20 has sidewardly connected thereto a drilling chip suction pipe 21, so that chips produced within the pressure foot 20 during the drilling operation is absorbed and removed by the suction of air from a suction device not illustrated. The pressure foot 20 is downwardly tapered or converges and has a tool passage hole 22 formed in the lower end thereof. As shown in FIG. 5, the size d of the tool passage hole 22 is such that when tool change is performed from below the hole 22 enables the passage therethrough of the outside diameter portion D of a tool post 51 holding a new tool T.

Figure 3:
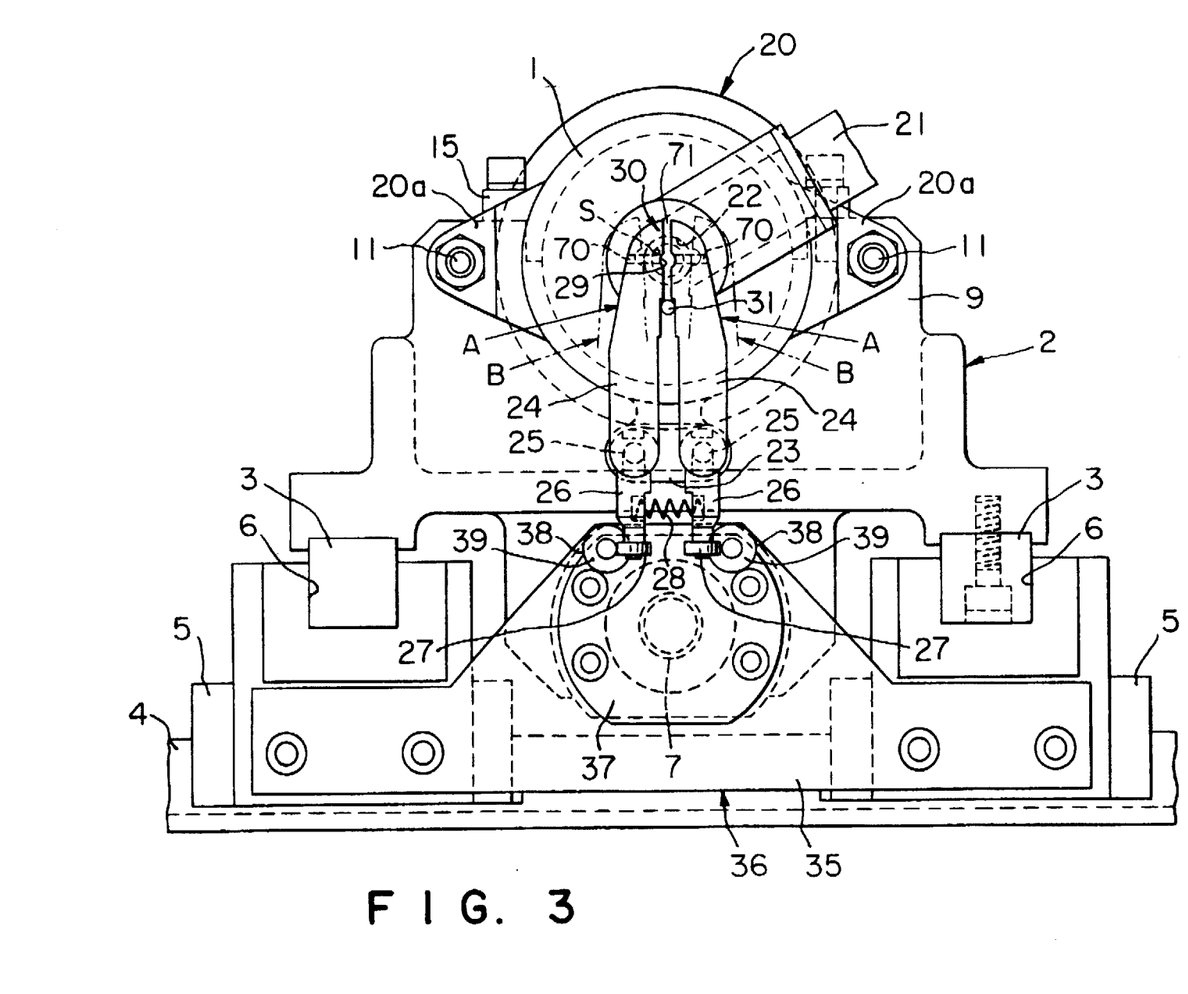
FIG. 3 is a bottom view taken in a direction III of FIG. 2.

As illustrated in FIG. 2, a holding portion 23 is provided on the rear surface of the pressure foot 20. On the holding portion 23 there are rotatably supported a pair of right and left supporting shafts 25 that are parallel with the axis of the tool. The supporting shafts 25 are provided at base portions 24a of opening/closing arms 24 serving as suppressing members. On each base portion 24a there is integrally provided a short arm 26 which extend further rearwardly. As illustrated in FIG. 3, at free ends of the respective short arms 26 there are provided cam followers (opening/closing operation portions) 27 which are mounted rotatably about axes lying in the longitudinal direction of the opening/closing arms 24. A spring 28 is interposed between the short arms 26, whereby the pair of opening/closing arms 24 are urged in directions to be closed.

Semi-circular cutouts 29 that mutually opposes each other are formed in forward ends of the opening/closing arms 24. In a state in which the pair of opening/closing arms 24 are closed, namely in a state in which the arms 24 are located at their suppressing positions A, the pair of notches 29 form a tool insertion hole 30 which is coaxial with the tool passage hole 22 of the pressure foot 20.

In the undersides of the forward ends of the arms 24 there are formed air inflow grooves 70, respectively, which extend transversely to the longitudinal directions of the arms 24. A limiting pin 31 (FIG. 2) for limiting the amount of closing of the opening/closing arms 24 is provided so that when the opening/closing arms 24 are closed by the force of the spring 28 the forward ends of the opening/closing arms 24 do not abut on each other and the prescribed tool insertion hole 30 may thereby be formed. The limiting pin 31 protrudes in a prescribed amount from the underside of the pressure foot 20. While the diameter of this tool insertion hole 30 is slightly larger than the diameter of the tool used, in this embodiment it is assumed that the tool diameter is from 0.1 mm to 1.0 mm or so and therefore the diameter of the tool insertion hole 30 is from 2 to 3 mm. The limiting pin 31 serves to form a small clearance between the two arms 24 in the closed state thereof and this clearnace defines an air inflow gap 71.

The pair of right and left guide members 5 at the lower side that are horizontally movable are connected to each other by a bearing case 35 as illustrated in FIG. 3 to thereby constitute a base member 36, and the lower end of the feed screw shaft 7 is rotatably supported by a bearing within the bearing case 35. A pair of vertical operating pins (operating members) 38 are provided on the lower side of a bearing cover 37 integrally secured to the bearing case 35, in correspondence with the cam followers 27. The positions in the front-to-rear direction of the operating pins 38 overlap those of the corresponding cam followers 27. The lower end of each operating pin 38 has a tapered or conical surface 39 (see FIG. 2) so that each cam follower 27 may be smoothly engaged with the operating pin 38.

Figure 4:
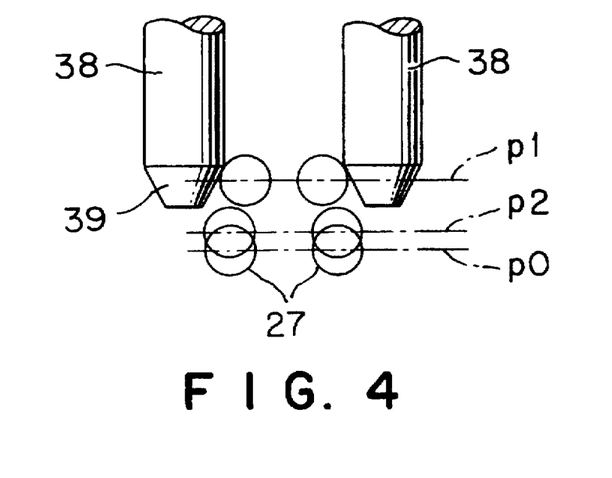
FIG. 4 is a view taken in a direction IV of FIG. 2, illustrating the height relationship between a cam follower and an operating pin.

The spacing as viewed in the right to left direction between the operating pins 38 is set as follows. The spindle unit 1 is raised from the height position P0 in which the pressure foot 20 is pressed against the printed-circuit board W (this height position of the spindle unit 1 varies during the drilling operation according to the depth of the drilled hole, etc.) through a higher position P2 (see FIG. 4) which corresponds to the next hole-drilling position up to a highest tool change position P1 (FIGS. 4 and 5) at which the underside of the opening/closing arm 24 is higher than the upper end of the shank of the new tool positioned at a new tool preparation position. During this upward movement, the cam followers 27 are caused to engage with the conical portions 39 of the operating pins 38, and the spacing between the cam followers 27 are made smaller so that the pair of opening/closing arms 24 are opened against the force of the spring 38. Consequently, the opening/closing arms 24 are moved to their retracted positions B (the two-dot chain line positions in FIG. 3) that are outside a tool passage zone S (FIG. 3) through which the tool post 51 passes when tool change is made. The spacing between the operating pins 38 is set so that this operation may be possible.

When drilling is performed after the change of the tool, the spindle unit 1 is lowered from the tool change position P1. At this time, each guide rod 11 has its hook portion 14 abutted on each guide bush 16 by the force of the compression spring 13, and therefore the pressure foot 20 and spindle unit 1 are lowered with their relative vertical position maintained as illustrated in FIG. 1. In this connection, the cam followers 27 are lowered from the tool change position P1in which the opening/closing arms 24 are opened and then the cam followers 27 are disengaged from the operating pins 38.

As a result, the opening/closing arms 24 which have been located at their retracted positions B are closed due to the force of the spring 28. The closure of the opening/closing arms 24 is limited by the pin 31, whereby the opening/closing arms 24 are located at their suppressing positions A. Thus the tool insertion hole 30 is coaxially formed on the lower side of the tool passage hole 22 by the pair of semi-circular cutouts 29. Through subsequent descending operation of the spindle unit 1, the pressure foot 20 suppresses the printed-circuit board W on the upper surface F of a table 40 through the opening/closing arms 24. The height position of the cam followers when the pressure foot 20 is in a state of its suppressing the board is shown at the position P0 in FIG. 4. When the spindle unit 1 is further lowered, the spindle unit 1 is moved downward relative to the pressure foot 20 while compressing the compression spring 13 of the guide rod 1, whereby the tool passes through the tool passage hole 22 and then through the tool insertion hole 30 to thereby form a hole in the printed-circuit board W (FIG. 2).

During the drilling operation of the tool T, the vicinity of the edge of the hole being drilled of the printed-circuit boards or plates W is suppressed by the opening/closing arms 24. Accordingly, floating of the printed-circuit board W which occurs due to the lead of the tool (drill) T during the drilling operation is suppressed whereby it is possible to avoid troubles such as production of warp or ingress of chips between the wired portions of the printed-circuit board W due to the floating thereof. Further, suction from the suction pipe 21 acts on the interior space of the pressure foot 20 so that air is induced into the pressure foot 20 through the air inflow grooves 70 and air inflow gap 71 and through the tool insertion hole 30. This causes sucking and removal of cutting chips on the upper surface W1 of the print circuit board W. When performing the next hole drilling operation, the spindle unit 1 is raised to arrive at the height position P2 in which the guide bushes 16 abut against and raise the hook portions 14 of the guide rods 11. At this time, the lower surfaces of the opening/closing arms 24 are spaced away from the upper surface W1 of the printed-circuit board W (the state illustrated in FIG. 1), and from this state the spindle unit 1 is further raised to the next hole drilling position. At the height position P2 through which the spindle unit 1 is moved upward, the height relationship between the cam followers 27 and the operating pins 38 is set so that the cam followers 27 are kept out of engagement with the operating pins 38 (FIG. 4) and therefore the opening/closing arms 24 are kept closed.

When performing the tool change operation, the spindle unit 1 is raised from the drilling position P0 to the tool change position P1 beyond the position P2. Then, during this rising movement, the cam followers 27 start to engage the conical portions 39 of the operating pins 38 and are caused to move in the directions toward each other. As a result, the opening/closing arms 24 are moved to their retracted positions B, whereby between the forward end portions of the opening/closing arms 24 is formed the passage zone S that enables the passage of the old tool T therethrough. Thereafter the used tool T is returned into an empty tool post 51 of a tool magazine 50 located coaxially with the spindle unit 1. Then, a tool post 51 having gripped therein a new tool T to be used next is located coaxially with the spindle unit 1. The tool post 51 is pushed upward to thereby pass the new tool T through the tool passage hole 22 of the pressure foot 20 from the passage zone between the forward end portions of the opening/closing arms 24, whereby the new tool T is mounted on the spindle 8.

Figure 6:
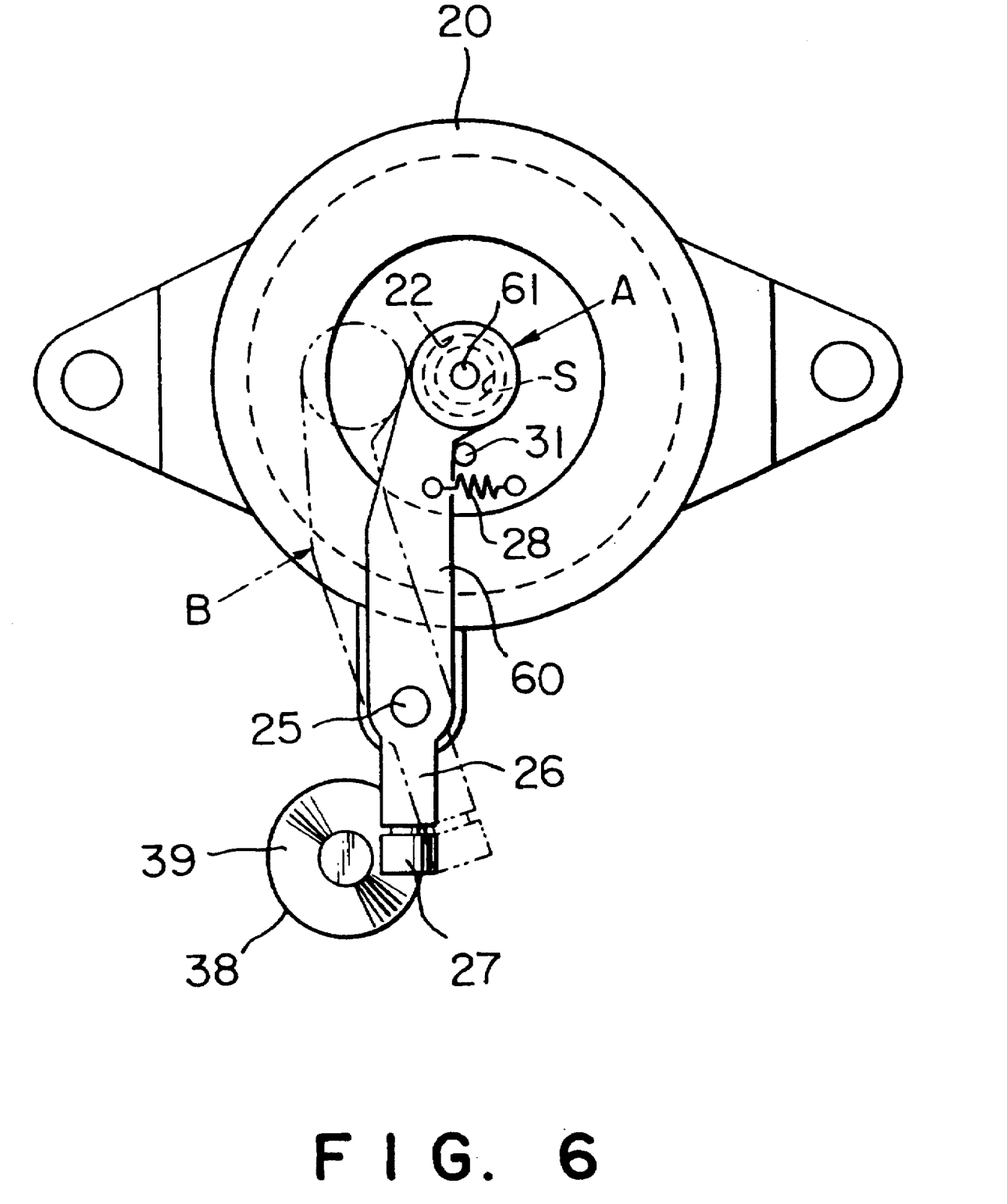
FIG. 6 is a bottom view illustrating another embodiment of the present invention.

In the above described embodiment, the suppressing members have been constituted by the pair of opening/closing arms 24. However, as illustrated in FIG. 6, a tool insertion hole 61 may be formed in a single suppressing member 60 rotatable about a supporting shaft 25. This suppressing member 60 is engaged with or disengaged from the operating pin 38 by utilizing the rising movement of the spindle unit 1 up to the tool change position so that the member 60 may be rotated between a retracted position B and a suppressing position A. In FIG. 6, portions having similar functions to those of the portions of the embodiment described before are denoted by like reference symbols and a description thereof is omitted.

In the above described embodiment, the suppressing members are moved by utilizing the vertical (axial) movement of the spindle 8. However, since the spindle is moved horizontally to the position where the spindle is in vertical alignment with the tool post of the tool magazine, this horizontal movement may be utilized for the movement of the suppressing member.

Figure 7:
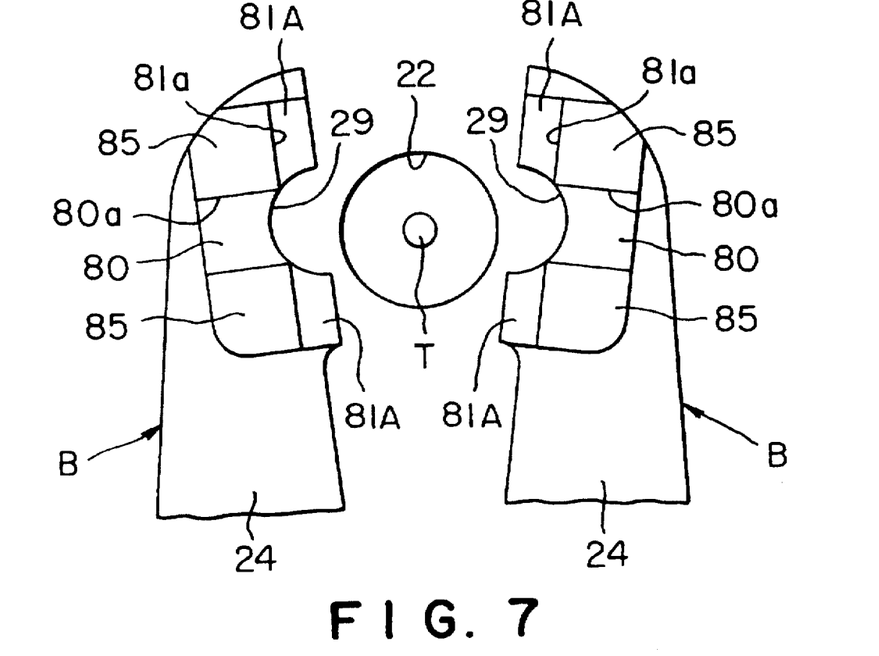
FIG. 7 shows a modification of the opening/closing arms, which are in retracted positions.
Figure 8:
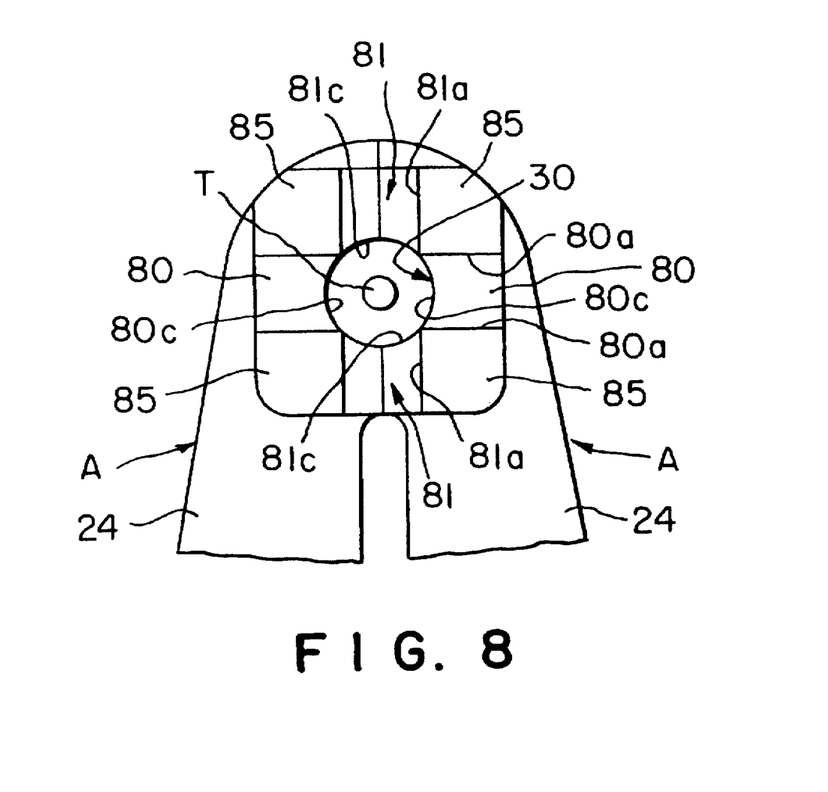
FIG. 8 shows the openign/closing arms in suppressing or closed positions.
Figure 9:
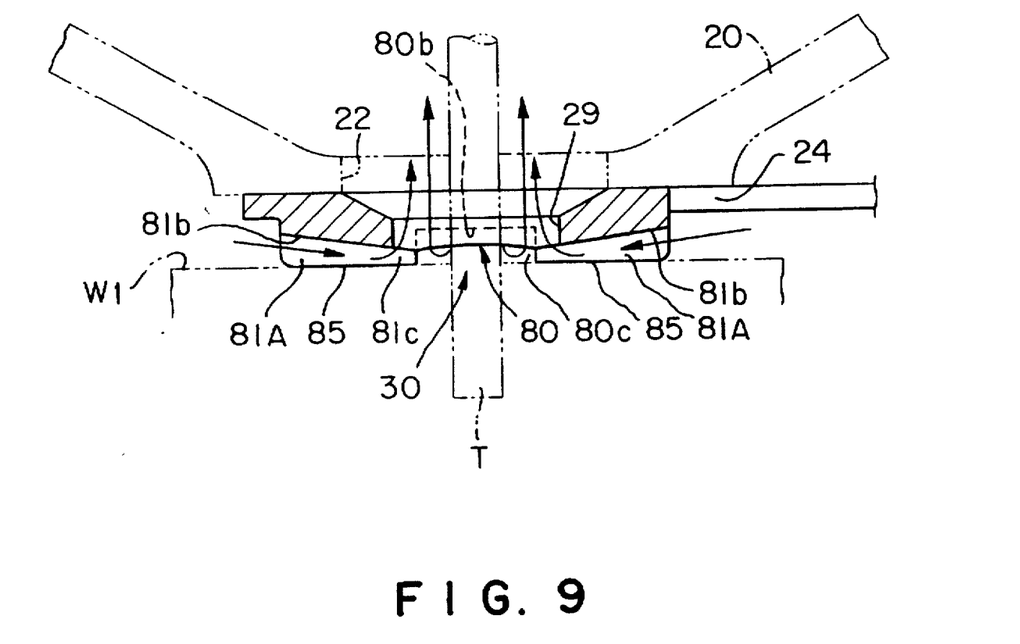
FIG. 9 is a vertical sectional view of FIG. 8.

FIGS. 7 through 9 show a modification of the opening/closing arms 24. The formed ends of the arms 24 are formed with air inflow grooves 80 in the undersurfaces thereof. The grooves 80 extend transversely to the longitudinal directions of the arms 24. Semi-circular cutouts 29 are formed adjacent the inflow grooves 80, respectively, in opposing positions. The undersurfaces of the forward ends of the arms 24 are also formed with recesses 81A extending in the longitudinal directions of the arms 24. The recesses 81A are positioned on the opposite sides of each cutout 29 with respect to the longitudinal driection of each arm 24. When the two arms 24 assume the closed or suppressing positions shown in FIG. 8, the four recesses 81A form air inflow grooves 81 on the opposite sides of the tool insertion hole 30 thus formed. The air inflow grooves 81 cross the air inflow grooves 80 with the tool insertion hole 30 disposed on the crossing area.

In the suppressing positions shown in FIG. 8, side walls 80a and 81a of the air inflow grooves 80 and 81 intersect along lines which are included in an imaginary cylinder of the inner surface of the tool insertion hole 30. Consequently, air inflow openings 80c and 81c of the air inflow grooves 80 and 81 are arranged without interruption around the tool insertion hole 30. This means that when air flows through these inflow grooves 80 and 81 into the tool insertion hole 30, no regions exist in which there is no inflow of air around the tool insertion hole 30. As shown in FIG. 9, bottom surfaces 80b and 81b of the air inflow grooves 80 and 81 are shaped to slope downward from the outer side to the inner side toward the tool insertion hole 30. Surfaces 85 adjacent the air inflow grooves 80 and 81 are made as abutting surfaces against the upper surface W1 of the printed-circuit board.

In this modification, air flows are induced through the grooves 80 and 81 and through the tool insertion hole 30 into the pressure foot 20 when suction is applied to the interior of the pressure foot 20, as indicated by arrows in FIG. 9. In this case, air flows obliquely downward due to the sloping bottom surfaces 80b and 81b of the grooves 80 and 81. The obliquely downward flows of air are directed against the upper surface W1 of the printed-circuit board W so that cutting chips are effectively blown up. Furthermore, since the four air inflow opening 80c ad 81c of the four air inflow grooves 80 and 81 are arranged without interruption around the entire lower periphery of the tool insertion hole 30, the inflowing air acts upon the entire periphery of the hole 30 whereby no stagnant areas are formed around the hole 30 and cutting chips are reliably sucked and removed.

As has been described above, according to the present invention, the spindle is moved to the tool change position. By utilizing this movement, the suppressing members are moved from their suppressing position to their retracted position. And in their retracted positions, the suppressing members are moved completley outward from the tool change zone in which the tool change operation is performed through the tool passage hole of the pressure foot. Accordingly, it is possible to control the movement of the suppressing members without special drive source being equipped, whereby the device becomes simplified. During the drilling operation, the suppressing members are located at their suppressing positions where the tool insertion hole of the suppressing members is lcoated coaxially with the tool passage hole of the pressure foot. Therefore, it is posible to suppress the vicinity of the drilled hole of the printed-circuit board around the edge portion of the tool insertion hole to thereby prevent floating of the printed-circuit board.

Although the invention has been described as being applied to a machine for drilling holes in printed-circuit boards, it is to be understood that the invention can be used for drilling holes in plates other than printed-circuit boards.

What is claimed is:

1. A plate suppressing device for a drilling apparatus for plates, the suppressing device comprising:

a pressure foot mounted on a forward end of an axially movably provided spindle unit and having a tool passage hole; and a suppressing member provided at a forward side of the pressure foot and forming a tool insertion hole which permits passage therethrough of a tool mounted on the forward end of the spindle unit when drilling is performed, said pressure foot suppressing and holding plates through the suppressing member while a hole is being drilled in the plates by the tool;

wherein the suppressing member is movable between a retracted position which is retracted from a tool passage zone in which tool change is performed through the tool passage hole of the pressure foot and a suppressing position in which the tool insertion hole of the suppressing member is coaxial with the tool passage hole of the pressure foot; and there is further provided means for moving the suppressing member from the suppressing position to the retracted position in response to movement of the spindle unit to a tool change position where a tool mounted on the forward end of the spindle unit is changed.

2. A plate suppressing device for a drilling apparatus, the suppressing device comprising:

a pressure foot mounted on a forward end of an axially movable spindle unit and having a tool passage hole; and suppressing members provided at a forward side of the pressure foot and forming a tool insertion hole which permits passage therethrough of a tool mounted on the forward end of the spindle unit unit when drilling is performed, said pressure foot suppressing and holding a plate through the suppressing members while a hole is being drilled in the plate by the tool;

wherein the suppressing members are movable between retracted positions which are retracted from a tool passage zone in which tool change is performed through the tool passage hole of the pressure foot and suppressing positions in which the tool insertion hole of the suppressing members is coaxial with the tool passage hole of the pressure foot; and there is further provided means for moving the suppressing members from the suppressing positions to the retracted positions in response to movement of the spindle unit to a tool change position where a tool mounted on the forward end of the spindle unit is changed.

3. The plate suppressing device according to claim 2, wherein said means for moving the suppressing members includes:

cam followers provided on said suppressing members, respectively;

stationary operating members positioned to act on said cam followers, respectively, to cause the suppressing members to move to said retracted positions when the spindle unit and hence the suppressing members are moved to said tool change position.

4. The plate suppressing device according to claim 3, wherein said suppressing members are a pair of oppositely disposed opening/closing arms which are pivotable between said suppressing positions and said retracted positions, and said cam followers are attached on one ends of the suppressing members.

5. The plate suppressing device according to claim 4, wherein said opening/closing arms have other ends which are shaped to form therebetween said tool insertion hole when the opening/closing arms are at said suppressing positions.

6. The plate suppressing device according to claim 5, wherein said opening/closing arms are urged to pivot to said suppressing positions by means of a spring.

7. The plate suppressing device according to claim 6, wherein said operating members are arranged to act on said cam followers against the force of the spring.

8. The plate suppressing device according to claim 3, wherein said stationary operating members are operating pins each having a conical end portion for acting on each of said cam followers.

9. The plate suppressing device according to claim 8, wherein said operating pins extend downward along a path of movement of the spindle unit.

10. The plate suppressing device according to claim 4, further including a limiting pin provided on the pressure foot to engage the opening/closing arms so as to limit an extent of pivoting movement of each of the opening and closing arms.

11. The plate suppressing device according to claim 2, wherein said suppressing members have in undersurfaces thereof and around said tool insertion hole thereof air inflow grooves for allowing air to flow therethrough and through the tool insertion hole into the pressure foot to which suction is applied, when the suppressing members are in the suppressing position.

12. The plate suppressing device according to claim 11, wherein said air inflow grooves have bottom surfaces sloping downward toward said tool insertion hole.

13. The plate suppressing device according to claim 11, wherein said air inflow grooves have air inflow openings connected to the tool insertion hole, said air inflow openings being arranged without interruption around a lower periphery of the tool insertion hole.

* * * * *